United States Patent
Li et al.

(10) Patent No.: US 11,581,507 B2
(45) Date of Patent: Feb. 14, 2023

(54) DISPLAY PANEL AND METHOD FOR MANUFACTURING SAME, AND DISPLAY APPARATUS

(71) Applicant: BOE Technology Group Co., Ltd., Beijing (CN)

(72) Inventors: Xiaolong Li, Beijing (CN); Ming Liu, Beijing (CN); Zheng Liu, Beijing (CN); Dawei Wang, Beijing (CN); Yanliu Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 176 days.

(21) Appl. No.: 16/768,146

(22) PCT Filed: Dec. 20, 2019

(86) PCT No.: PCT/CN2019/126876
§ 371 (c)(1),
(2) Date: May 29, 2020

(87) PCT Pub. No.: WO2020/199663
PCT Pub. Date: Oct. 8, 2020

(65) Prior Publication Data
US 2021/0234124 A1    Jul. 29, 2021

(30) Foreign Application Priority Data
Mar. 29, 2019   (CN) .......................... 201910251706.8

(51) Int. Cl.
*H01L 51/52* (2006.01)
*H01L 27/32* (2006.01)
*H01L 51/56* (2006.01)

(52) U.S. Cl.
CPC ........ *H01L 51/5253* (2013.01); *H01L 27/323* (2013.01); *H01L 27/3227* (2013.01);
(Continued)

(58) Field of Classification Search
CPC ............... H01L 51/447; H01L 51/5275; H01L 51/5268; H01L 29/868; H01L 51/5253;
(Continued)

(56) References Cited

U.S. PATENT DOCUMENTS

| 7,902,567 B2 | 3/2011 | Oh |
| 2012/0326131 A1 | 12/2012 | Han et al. |
| 2014/0320000 A1 | 10/2014 | Wakahara et al. |
| 2016/0093828 A1 | 3/2016 | Kim et al. |
| 2017/0154927 A1* | 6/2017 | Jo .......................... H01L 27/288 |

(Continued)

FOREIGN PATENT DOCUMENTS

| CN | 103975647 A | 8/2014 |
| CN | 105470405 A | 4/2016 |

(Continued)

OTHER PUBLICATIONS

International search report of PCT application No. PCT/CN2019/126876 dated Mar. 19, 2020.
(Continued)

*Primary Examiner* — Latanya N Crawford Eason
(74) *Attorney, Agent, or Firm* — Fay Sharpe LLP

(57) ABSTRACT

A display panel is provided, which includes a base substrate, and a light-emitting device and an encapsulation structure sequentially arranged on the base substrate. The encapsulation structure includes at least one first encapsulation film layer, the first encapsulation film layer includes at least two inorganic layers arranged in a stack, and refractive indexes of the at least two inorganic layers sequentially increase in a direction close to the light-emitting device. The first encapsulation film layer is configured to adjust an angle of an ambient light incident on the light-emitting device to reduce the ambient light reflected from the display panel.

16 Claims, 13 Drawing Sheets

(52) U.S. Cl.
CPC ...... *H01L 27/3244* (2013.01); *H01L 51/5284* (2013.01); *H01L 51/56* (2013.01); *H01L 2227/323* (2013.01)

(58) Field of Classification Search
CPC ............... H01L 27/3227; H01L 27/323; H01L 27/3244; H01L 51/5284; H01L 51/56; H01L 2227/323; H01L 51/5262; H01L 51/5256; H01L 27/3225; H01L 2924/12031; H01L 33/012
See application file for complete search history.

(56) References Cited

U.S. PATENT DOCUMENTS

2018/0047800 A1\* 2/2018 Choi ................... G09G 3/3233
2020/0083490 A1   3/2020 Zhang

FOREIGN PATENT DOCUMENTS

| CN | 106229420 A | 12/2016 |
| CN | 108039421 A | 5/2018 |
| CN | 108666344 A | 10/2018 |
| CN | 108899438 A | 11/2018 |
| CN | 109841758 A | 6/2019 |

OTHER PUBLICATIONS

First office action of Chinese application No. 201910251706.8 dated Mar. 3, 2020.

\* cited by examiner

DISPLAY PANEL AND METHOD FOR MANUFACTURING SAME, AND DISPLAY APPARATUS

CROSS-REFERENCE TO RELATED APPLICATION

The present application is a 371 of PCT Application No. PCT/CN2019/126876, filed on Dec. 20, 2019, which claims priority to Chinese Patent Application No. 201910251706.8 titled "DISPLAY PANEL AND METHOD FOR MANUFACTURING SAME, AND DISPLAY APPARATUS" filed on Mar. 29, 2019, the entire content of which is incorporated herein by reference.

TECHNICAL FIELD

The present application relates to the field of display technologies, and in particular to a display panel and a method for manufacturing the same, and a display apparatus.

BACKGROUND

With the development of display technology, more and more organic light emitting diode (OLED) display panels are applied to high-performance display products due to their high brightness, wide color gamut, high resolution and low power consumption.

An OLED display panel has a light-emitting device, and the light-emitting device includes a light emitting layer and electrodes (such as an anode and a cathode) for driving the light emitting layer to emit light. The OLED display panel realizes display through emitting light by the light emitting layer. In an environment where the OLED display panel is located, an ambient light irradiated to the light-emitting device at a certain angle will be reflected on the electrodes of the light-emitting device to generate reflected light, and the reflected light may interfere with the light emitted by the OLED display panel (i.e., the light generated by the light-emitting device and emitted from the OLED display panel).

SUMMARY

In a first aspect, a display panel is provided. The display panel includes:

a base substrate, and a light-emitting device and an encapsulation structure sequentially arranged on the base substrate;

wherein the encapsulation structure includes at least one first encapsulation film layer, the first encapsulation film layer includes at least two inorganic layers arranged in a stack, and refractive indexes of the at least two inorganic layers sequentially increase in a direction close to the light-emitting device, the first encapsulation film layer is configured to adjust an angle of an ambient light incident on the light-emitting device to reduce the ambient light reflected from the display panel.

In a second aspect, a method for manufacturing a display panel is provided. The method includes:

providing a base substrate;

forming a light-emitting device on the base substrate;

forming an encapsulation structure on a side, away from the base substrate, of the light-emitting device, the encapsulation structure includes at least one first encapsulation film layer, the first encapsulation film layer includes at least two inorganic layers arranged in a stack, and refractive indexes of the at least two inorganic layers sequentially increase in a direction close to the light-emitting device, the first encapsulation film layer is configured to adjust an angle of an ambient light incident on the light-emitting device to reduce an amount of ambient light reflected from the display panel.

In a third aspect, a display apparatus is provided. The display apparatus includes a display panel according to the first aspect or any alternative manner of the first aspect, and a touch panel and a protective film sequentially arranged on a light exiting surface of the display panel.

It is to be understood that both the foregoing general description and the following detailed description are exemplary only and are not intended to limit the present disclosure.

BRIEF DESCRIPTION OF THE DRAWINGS

In order to describe the embodiments of the present more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

The accompanying drawings, which are incorporated in and constitute a part of this specification, illustrate embodiments consistent with the present disclosure, and together with the description, serve to explain the principles of the present disclosure.

DETAILED DESCRIPTION

For clearer descriptions of the objects, technical solutions and advantages in the present disclosure, the present disclosure is described in detail below in combination with the accompanying drawings. Apparently, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

In the display industry, a polarizer is usually attached to a light exiting surface of an OLED display panel to reduce interference of ambient lights on lights emitted by the OLED display panel. However, a large thickness of the polarizer causes the polarizer to have a great influence on light extraction efficiency of the OLED display panel, and also results in a large thickness of the display panel and it is difficult to obtain a thin display panel.

Embodiments of the present application provide a display panel and a method for manufacturing the same, and a display apparatus, interference of ambient lights on lights emitted by the display panel can be reduced without providing a polarizer, and thus ensure light extraction efficiency of the display panel and obtain a thin display panel. For detailed solutions of the present application, please refer to the following embodiments.

Figure 1:
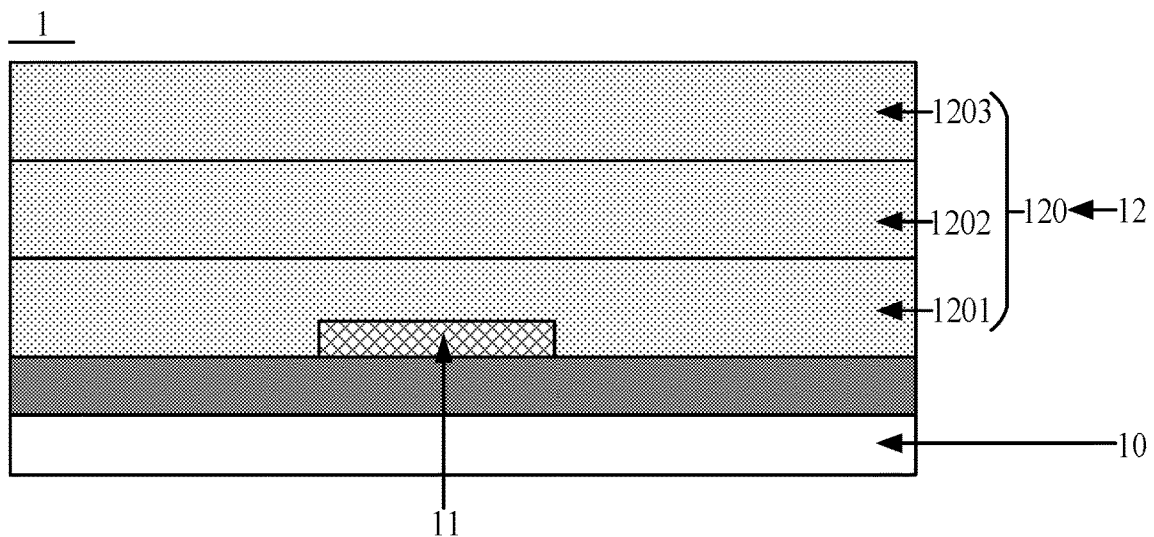
FIG. 1 is a schematic structural diagram of a display panel provided by an embodiment of the present application.

Please refer to FIG. 1, which shows a schematic structural diagram of a display panel 1 provided by an embodiment of the present application. The display panel 1 includes a base substrate 10, and a light-emitting device 11 and an encapsulation structure 12 sequentially arranged on the base substrate 10. The encapsulation stricture 12 includes at least one first encapsulation film layer 120 (one shown in FIG. 1), the first encapsulation film layer 120 includes at least two inorganic layers (three shown in FIG. 1) arranged in a stack, and refractive indexes of the at least two inorganic layers sequentially increase in a direction close to the light-emitting device 11. For example, as shown in FIG. 1, the first encapsulation film layer 120 includes a first inorganic layer 1201, a second inorganic layer 1202 and a third inorganic layer 1203 arranged in a stack. The third inorganic layer 1203, the second inorganic layer 1202 and the first inorganic layer 1201 are stacked in a direction close to the light-emitting device 11. Therefore, refractive indexes of the third inorganic layer 1203, the second inorganic layer 1202 and the first inorganic layer 1201 sequentially increase in the direction close to the light-emitting device 11, that is, the refractive index of the first inorganic layer 1201 is greater than the refractive index of the second inorganic layer 1202, and the refractive index of the second inorganic layer 1202 is greater than the refractive index of the third inorganic layer 1203.

Wherein, the first encapsulation film layer 120 is configured to adjust an angle of an ambient light incident on the light-emitting device 11 to reduce the ambient light reflected from the display panel 1. The first encapsulation film layer 120 includes at least two inorganic layers arranged in a stack, refractive indexes of which sequentially increase in the direction close to the light-emitting device 11. Therefore, when an ambient light passes through the first encapsulation film layer 120, it will be refracted and reflected at an interface of each adjacent two inorganic layers, such that the angle of the ambient light incident on the light-emitting device 11 is changed. Therefore, the first encapsulation film layer 120 can be used to adjust the angle of an ambient light incident on the light-emitting device 11.

Figure 2:
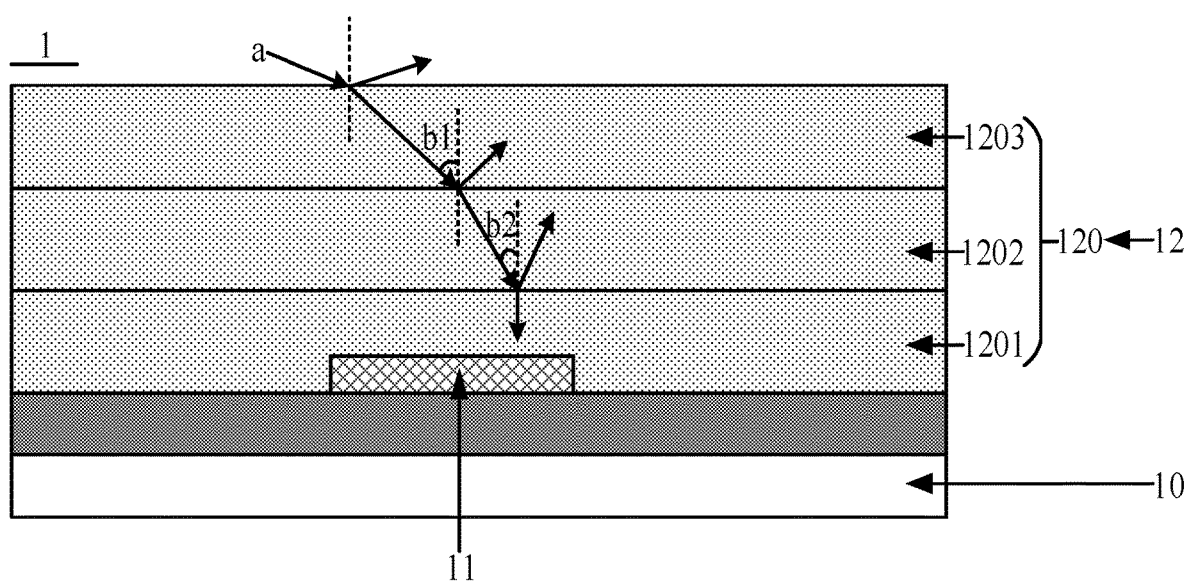
FIG. 2 is a schematic diagram of propagation of an ambient light in a first encapsulation film layer provided by an embodiment of the present application.

Exemplarily, please refer to FIG. 2, which shows a schematic diagram of propagation of an ambient light through a first encapsulation film layer 120. Referring to FIG. 2, during the propagation of an ambient light a through a first encapsulation film layer 120, when the ambient light a is incident on a second inorganic layer 1202 from a third inorganic layer 1203 at an incident angle hi, the ambient light a is refracted and reflected at an interface between the third inorganic layer 1203 and the second inorganic layer 1202, and then, refracted light is incident on a first inorganic layer 1201 at an incident angle b2, and is refracted and reflected at an interface between the second inorganic layer 1202 and the first inorganic layer 1201. Since refractive index of the third inorganic layer 1203 is smaller than refractive index of the second inorganic layer 1202, and refractive index of the second inorganic layer 1202 is smaller than refractive index of the first inorganic layer 1201, the incident angle b2 is smaller than the incident angle b1. Therefore, during propagation of the ambient light a through the first encapsulation film layer 120, the first encapsulation film layer 120 can adjust the angle of the ambient light a, so that the ambient light incident on the light-emitting device 11 tends to be perpendicular to a surface of the light-emitting device 11 (i.e., the ambient light incident on the light-emitting device 11 is parallel to a normal), and the ambient light incident on the light-emitting, device 11 is prevented from being reflected from the light-emitting device 11, thereby reducing the ambient light reflected from the display panel 1.

In summary, in a display panel provided by embodiments of the present application, an encapsulation structure includes a first encapsulation film layer, the first encapsulation film layer includes at least two inorganic layers, refractive indexes of the at least two inorganic layers sequentially increase in a direction close to the light-emitting device, and the first encapsulation film layer can adjust an angle of an ambient light through refraction and reflection of the ambient light of the two inorganic layers to reduce the ambient light reflected from the display panel, thereby reducing interference of ambient lights on lights emitted by the display panel. Since interference of ambient lights on lights emitted by the display panel can be reduced without providing a polarizer, light extraction efficiency of the display panel can be ensured and a thin display panel can be obtained.

Optionally, a thickness of the first inorganic layer 1201 may be 200 nm (nanometers) to 300 nm, and refractive index thereof may be 1.9 to 2.2; for example, a thickness of the first inorganic layer 1201 may be 200 nm, 248 nm, 260 nm or 300 nm, and refractive index thereof may be 1.9, 2.0, 2.1 or 2.2. A thickness of the second inorganic layer 1202 may be 300 nm to 400 nm, and refractive index thereof may be 1.5 to 1.7; for example, a thickness of the second inorganic layer 1202 may be 300 nm, 348 nm, 360 nm or 400 nm, and refractive index thereof may be 1.5, 1.55, 1.6 or 1.7. A thickness of the third inorganic layer 1203 may be 500 nm to 600 nm, and refractive index thereof may be 1.1 to 1.2; for example, a thickness of the third inorganic layer 1203 may be 500 nm, 548 nm, 560 nm or 600 nm, and refractive index thereof may be 1.12, 1.14, 1.17 or 1.2, Optionally, material of the first inorganic layer 1201 may be silicon nitride ($SiN_x$), material of the second inorganic layer 1202 may be silicon oxynitride (SiON), and material of the third inorganic layer 1203 may be silicon dioxide ($SiO_2$).

Figure 3:
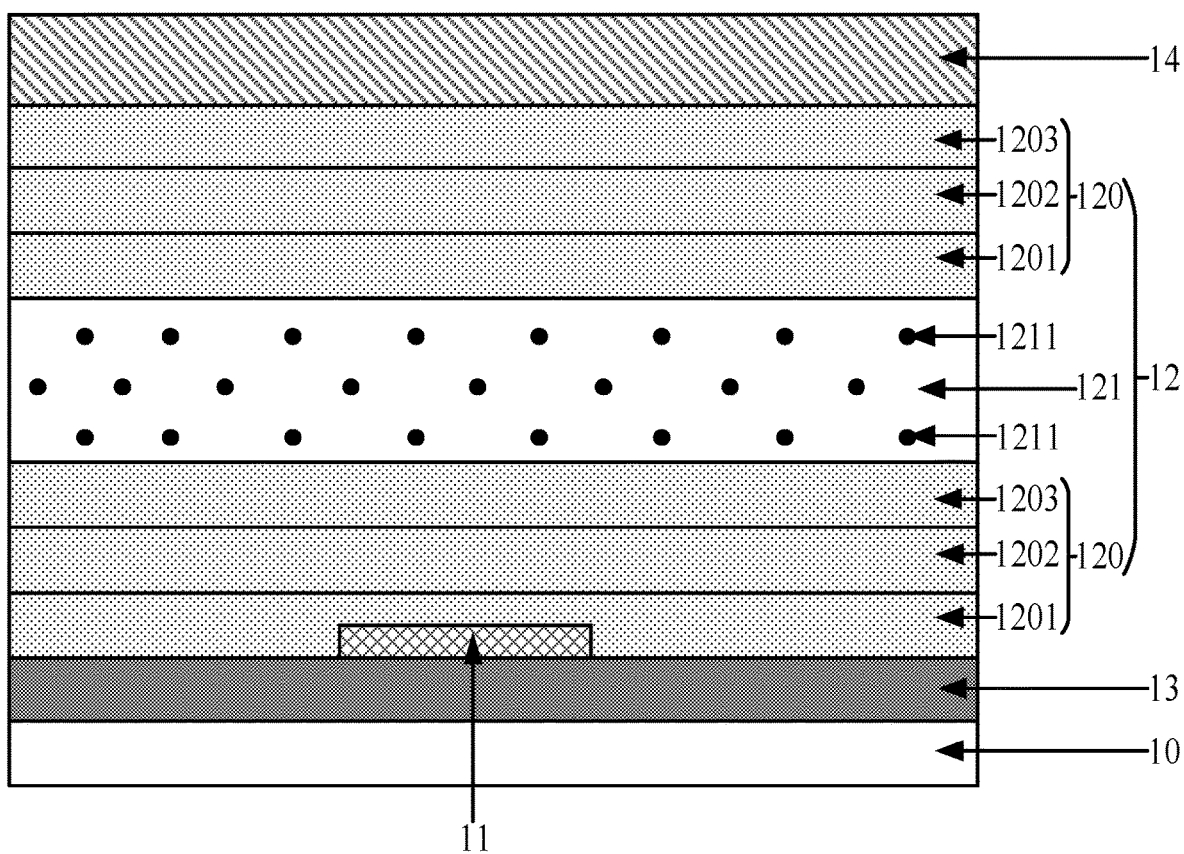
FIG. 3 is a schematic structural diagram of another display panel provided by an embodiment of the present application.

Exemplarily, please refer to FIG. 3, which shows a schematic structural diagram of another display panel 1 provided by an embodiment of the present application. Referring to FIG. 3, on the basis of FIG. 1, the encapsulation structure 12 further includes: a second encapsulation film layer 121 stacked on the first encapsulation film layer 120, the second encapsulation film layer 121 is doped with a light absorption particle 1211, and the light absorption particle 1211 is configured to absorb an ambient light incident on the second encapsulation film layer 121. Optionally, the second encapsulation film layer 121 may be an organic layer, and the light absorption particle 1211 may be an inorganic particle. Exemplarily, the light absorption particle 1211 may be a $SiO_2$ particle. Wherein, a thickness of the second encapsulation film layer 121 may be 8 μm (micrometers) to 12 μm, and a diameter of the light absorption particle 1211 may be 1 μm to 2 μm. The light absorption particle 1211 can absorb the ambient light incident on the second encapsulation film layer 120 and reduce the ambient light reaching the light-emitting device 11.

Optionally, in an embodiment of the present application, an encapsulation structure includes a first encapsulation film layer and a second encapsulation film layer alternately stacked. Exemplarily, as shown in FIG. 3, the encapsulation structure 12 includes a first encapsulation film layer 120, a second encapsulation film layer 121 and another first encapsulation film layer 120 that are stacked in a direction away from the base substrate 10. Each first encapsulation film layer 120 includes three inorganic layers arranged in a stack, and the three inorganic layers are respectively a first inorganic layer 1201, a second inorganic layer 1202 and a third inorganic layer 1203 that are sequentially arranged in a direction away from the light-emitting device 11, Refractive indexes of the third inorganic layer 1203, the second inorganic layer 1202 and the first inorganic layer 1201 sequentially increase in a direction close to the light-emitting device 11.

Exemplarily, please continue to refer to FIG. 3, the display panel 1 further includes a thin film transistor (TFT) 13 located between the base substrate 10 and the light-emitting device 11, and a photoelectric device 14 on a side, away from the light-emitting device 11, of the encapsulation structure 12. The ITT 13 may include a gate, a gate insulation layer, an active layer, an interlayer dielectric layer, a source and a drain (none are shown in FIG. 3). The TFT 13 may be an amorphous silicon (a-si) TFT, an oxide TFT, or a low temperature poly-silicon (LTPS) TFT. The photoelectric device 14 has a light-transmitting area (not shown in FIG. 3), and an orthographic projection area of the light emitting device 11 on the base substrate 10 is located in an orthographic projection area of the light-transmitting area on the base substrate 10. In this way, the photoelectric device 14 can be prevented from blocking light emitted by the light-emitting device 11.

In an embodiment of the present application, the photoelectric device 14 may have a light-transmitting area and a non-light-transmitting area, alternatively, the photoelectric device 14 is a transparent device, so that the photoelectric device 14 has a light-transmitting area. The photoelectric device 14 will be explained in two implementations below.

The first implementation: the photoelectric device 14 has a light-transmitting area and a non-light-transmitting area.

Figure 4:
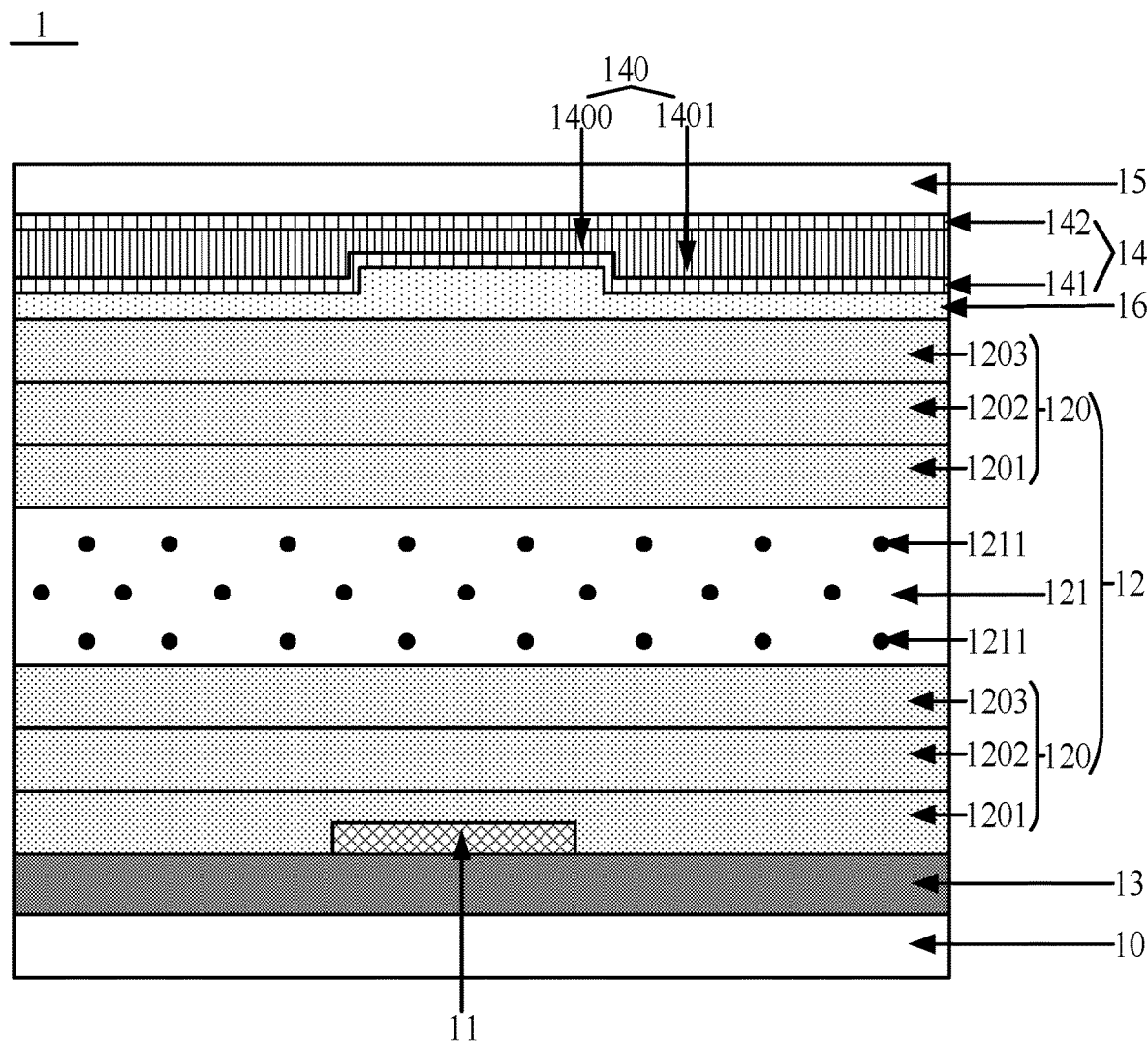
FIG. 4 is a schematic structural diagram of a further display panel provided by an embodiment of the present application.

Please refer to FIG. 4, which shows a schematic structural diagram of a further display panel 1 provided by an embodiment of the present application. Referring to FIG. 4, a photoelectric device 14 has a light-transmitting area (not shown in FIG. 4) and a non-light-transmitting area (not shown in FIG. 4). The photoelectric device 14 includes a semiconductor structure layer 140 having a first electrode 141 and a second electrode 142. The first electrode 141 is located on a side, close to the encapsulation structure 12, of the semiconductor structure layer 140 and the second electrode 142 is located on a side, away from the encapsulation structure 12, of the semiconductor structure layer 140. Both the first electrode 141 and the second electrode 142 may be indium tin oxide (ITO) electrodes. Both the first electrode 141 and the second electrode 142 may have a thickness of 80 nm to 100 nm, for example, a thickness of the first electrode 141 may be 82 nm, 88 nm, 95 nm or 99 nm, and a thickness of the second electrode 142 may be 80 nm, 90 nm, 95 nm or 100 nm.

Optionally, the semiconductor structure layer 140 includes a semiconductor thin film 1400 located in the light-transmitting area of the photoelectric device 14 and a PIN structure 1401 located in the non-light-transmitting area of the photoelectric device 14, and a thickness of the semiconductor thin film 1400 is smaller than a thickness of the PIN structure 1401. The PIN structure 1401 may include a P-type semiconductor layer, an intrinsic semiconductor layer and an N-type semiconductor layer that are sequentially stacked (none are shown in FIG. 4). The semiconductor thin film 1400 may be obtained by thinning the PIN structure. It is easy to be understood that the semiconductor thin film 1400 may include a P-type semiconductor layer, an N-type semiconductor layer and/or an intrinsic semiconductor layer. The P-type semiconductor layer may be a P-type doped a-Si thin film, the intrinsic semiconductor layer may be an a-Si thin film, and the N-type semiconductor layer may be an N-type doped a-Si thin film. Exemplarily, the P-type semiconductor layer may be doped with boron (B) ions, and the N-type semiconductor layer may be doped with phosphorus (P) ions. Optionally, a thickness of the semiconductor thin film 1400 may be 50 nm to 70 nm, for example, a thickness of the semiconductor thin film 1400 may be 50 nm, 60 nm, 65 nm or 70 nm. A thickness of the PIN structure 1401 may be 2 μm to 3 μm, for example, a thickness of the PIN structure 1401 may be 2 μm, 2.4 μm, 2.8 μm or 3 μm. It should be noted that the photoelectric device 14 is used to convert an optical signal of an ambient light into an electrical signal through the PIN structure 1401, and the semiconductor thin film 1400 may not be used as a functional layer during photoelectric conversion by the photoelectric device 14.

In an embodiment of the present application, the semiconductor thin film 1400 is light transmissive. Assuming that light transmittance of the semiconductor thin film 1400 is c, and an aperture ratio (a ratio of an area of the light emitting area to an area of the display area) of the display panel 1 is d, then a ratio of an area of the non-light-emitting area of the display panel 1 to the area of the display area is 1-d. Normally, reflectance of the non-light-emitting area to an ambient light is 5%, and reflectance of the light-emitting device 11 to the ambient light is not less than 90%. Since the orthographic projection area of the light emitting device 11 on the base substrate 10 is located in the orthographic projection area of the light-transmitting area (the semiconductor thin film 1400) of photoelectric device 14 on the base substrate 10, the ambient light can be irradiated to the light-emitting device 11 through the light-transmitting area (the semiconductor thin film 1400) and reflected by the light-emitting device 11, and reflected light can be emitted from a light exiting surface of the display panel 1 through the light-transmitting area of the photoelectric device 14. Assuming that reflectance of the light-emitting device 11 to the ambient light is 90%, then reflectance of the display panel 1 to the ambient light is: (1-d)×5%+d×c×90% 9×c. In an embodiment of the present application, when a thickness of the semiconductor thin film 1400 is 50 nm to 70 nm, light transmittance of the semiconductor thin film 1400 is 40% to 45%. Assuming that light transmittance of the semiconductor thin film 1400 is 45% (c=45%), the reflectance of the light-emitting device 11 to the ambient light is 90%, the aperture ratio of the display panel 1 is 20% (d=20%), and the ratio of the area of the non-light-emitting area of the display panel 1 to the area of the display area is 80%, then reflectance of the display panel 1 to the ambient light may be 80%×5%+20%×45%×90%×45%≈7%. It can be seen that the solution provided by the embodiments of the present application can reduce reflectance of the display panel to the ambient light to 7% without providing a polarizer.

Optionally, please continue to refer to FIG. 4, the display panel 1 further includes a flexible base 15 located on a side, away from the encapsulation structure 12, of the photoelectric device 14, and a bonding layer 16 located between the photoelectric device 14 and the encapsulation structure 12. The flexible base 15 may be a flexible base made of flexible transparent materials such as polyimide (PI), and a thickness of the flexible base 15 may be 10 μm. The material of the bonding layer 16 may be an optical clear adhesive (OCA) or an ultraviolet ray (UV) curing adhesive.

It should be noted that, in the first implementation, the bonding layer 16 is used to bond the photoelectric device 14 and the encapsulation structure 12, and the flexible base 15 is used as a base of the photoelectric device 14. Those skilled in the art can easily understand that the display panel 1 may not have the flexible base 15 and the bonding layer 16, and the photoelectric device 14 is directly prepared on the encapsulation structure 12, which is not limited in the embodiments of the present application.

The second implementation: the photoelectric device 14 is a transparent device, so that the photoelectric device 14 has a light-transmitting area.

Figure 5:
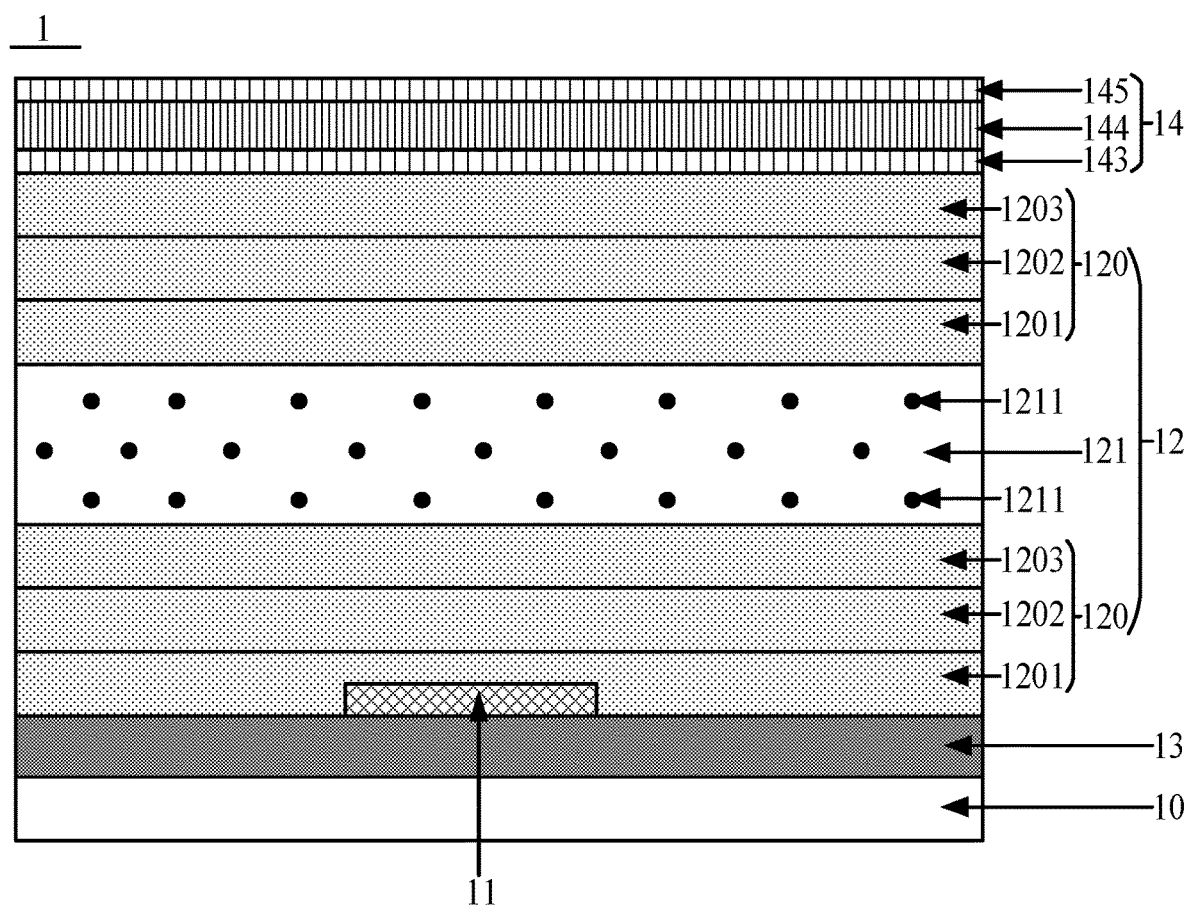
FIG. 5 is a schematic structural diagram of a still further display panel provided by an embodiment of the present application.

Please refer to FIG. 5, which shows a schematic structural diagram of a still further display panel 1 provided by an embodiment of the present application. Referring to FIG. 5, the photoelectric device 14 includes a first electrode 143, a PIN structure 144 and a second electrode 145 sequentially stacked in a direction away from the encapsulation structure 12, Both the first electrode 143 and the second electrode 145 may have a thickness of 50 nm to 70 nm, for example, a thickness of the first electrode 143 is 50 nm, 55 nm, 60 nm or 70 nm, and a thickness of the second electrode 145 is 50 nm, 54 nm, 65 nm or 70 nm. A thickness of the PIN structure 144 may be 50 nm to 100 nm, for example, a thickness of the PIN structure 144 is 50 nm, 60 nm, 70 nm or 100 nm. For related descriptions of the PIN structure 144, reference may be made to the foregoing first implementation, which is not described in detail in the embodiments of the present application.

It should be noted that, in the second implementation, the display panel 1 may further include a flexible base located on a side, away from the encapsulation structure 12, of the photoelectric device 14, and a bonding layer located between the photoelectric device 14 and the encapsulation structure 12. For related descriptions of the flexible base and the bonding layer, reference may be made to the first implementation described above. It is easy to be understood that the display panel 1 may not include a flexible base and a bonding layer, which is not limited in the embodiments of the present application.

In an embodiment of the present application, the above base substrate 10 may be a hard substrate made of a light-guiding and non-metallic material with certain rigidity such as glass, quartz, transparent resin or the like; alternatively, the base substrate 10 may be a flexible substrate made of a flexible material such as PI and the like. In a case that the base substrate 10 is a flexible substrate, the display panel 1 may be a flexible display panel. Accordingly, both the light-emitting device 11 and the photoelectric device 14 are flexible devices. Optionally, the display panel 1 may be an electroluminescence (EL) display panel and accordingly the above light-emitting device 11 may be an electroluminescence (EL) device. For example, the display panel 1 may be an OLED display panel or a quantum dot light emitting diode (QLED) display panel, and the light-emitting device 11 may be an OLE) device or a QLED device. The OLED display panel may be an active matrix organic light emitting diode (AMOLED) display panel or a passive matrix organic light emitting diode (PMOLED) display panel, and the light-emitting device 11 may include an electroluminescence layer, and an anode and a cathode for driving the electroluminescence layer to emit light.

It should be noted that the photoelectric device 14 can perform a photoelectric conversion to convert an optical signal of an ambient light into an electrical signal, Therefore, the photoelectric device 14 can be used as a solar cell of the display panel 1 to supply power to the display panel 1. In addition, in the embodiments of the present application, a thickness of any, structure refers to a size of the structure in a direction perpendicular to a surface of the base substrate. For example, a thickness of the first inorganic layer 1201 is a size of the first inorganic layer 1201 in a direction perpendicular to the surface of the base substrate 10, For another example, a thickness of the PIN structure 1401 is a size of the PIN structure 1401 in a direction perpendicular to the surface of the base substrate 10, which will not be described herein in the embodiments of the present application.

In summary, in a display panel provided by embodiments of the present application, an encapsulation structure includes a first encapsulation film layer, the first encapsulation film layer includes at least two inorganic layers, refractive indexes of the at least two inorganic layers sequentially increase in a direction close to the light-emitting device, and the first encapsulation film layer can adjust an angle of an ambient light through refraction and reflection of the ambient light of the two inorganic layers to reduce the ambient light reflected from the display panel, thereby reducing interference of ambient lights on lights emitted by the display panel. Since interference of ambient lights on lights emitted by the display panel can be reduced without providing a polarizer, light extraction efficiency of the display panel can be ensured and a thin display panel can be obtained. Further, the photoelectric device can convert an optical signal of an ambient light into an electrical signal to supply power to the display panel, so the photoelectric device can be used as a battery of the display panel.

For the manufacturing method and manufacturing principle of the display panel in the embodiments of the present application, please refer to the descriptions in the following embodiments.

Figure 6:
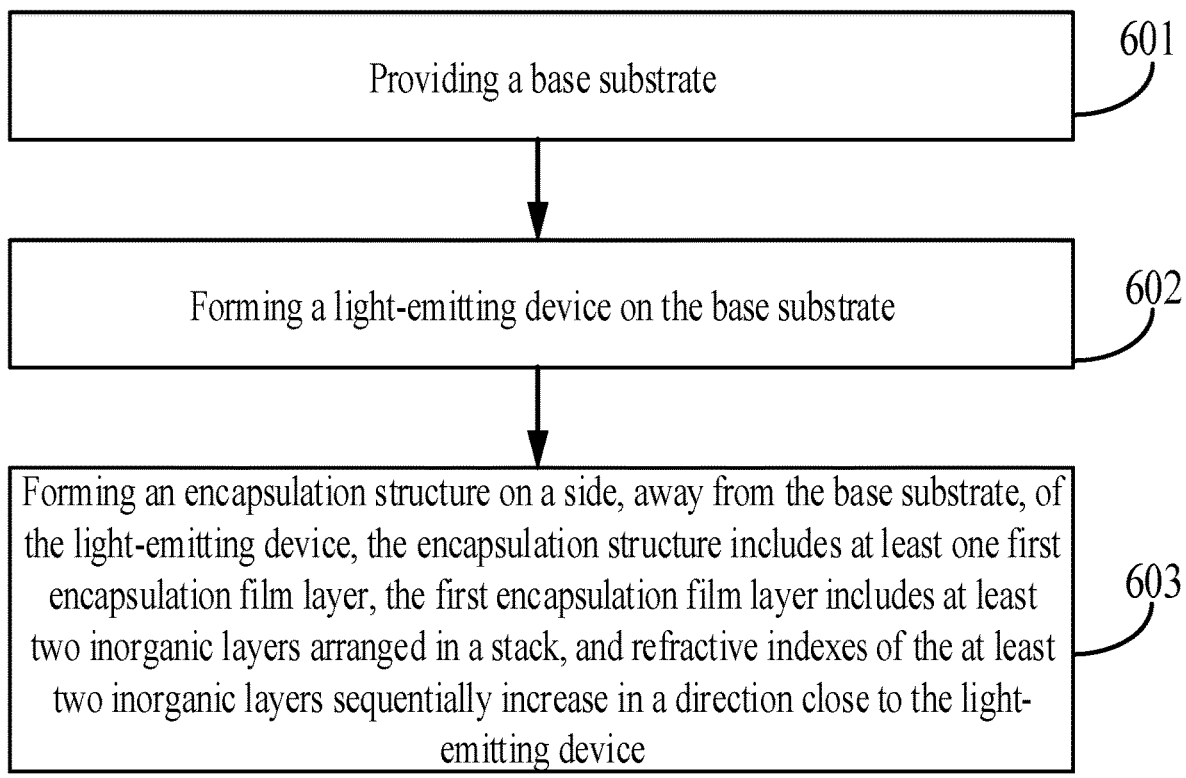
FIG. 6 is a flowchart of a method for manufacturing a display panel provided by an embodiment of the present application.

Please refer to FIG. 6, which shows a flowchart of a method for manufacturing a display panel provided by an embodiment of the present application. This method for manufacturing a display panel can be used to manufacture the display panel 1 as shown in any one of FIGS. 1 to 5. Referring to FIG. 6, the method for manufacturing a display panel includes the following steps.

In step 601, a base substrate is provided.

In step 602, a light-emitting device is formed on the base substrate.

In step 603, an encapsulation structure is formed on a side, away from the base substrate, of the light-emitting device, the encapsulation structure includes at least one first encapsulation film layer, the first encapsulation film layer includes at least two inorganic layers arranged in a stack, and refractive indexes of the at least two inorganic layers sequentially increase in a direction close to the light-emitting device.

The first encapsulation film layer is configured to adjust an angle of an ambient light incident on the light-emitting device to reduce the ambient light reflected from the display panel.

In summary, in a display panel manufactured by a method for manufacturing a display panel provided by embodiments of the present application, an encapsulation structure includes a first encapsulation film layer, the first encapsulation film layer includes at least two inorganic layers, refractive indexes of the at least two inorganic layers sequentially increase in a direction close to the light-emitting device, and the first encapsulation film layer can adjust an angle of an ambient light through refraction and reflection of the ambient light of the two inorganic layers to reduce the ambient light reflected from the display panel, thereby reducing interference of ambient lights on lights emitted by the display panel, Since interference of ambient lights on lights emitted by the display panel can be reduced without providing a polarizer, light extraction efficiency of the display panel can be ensured and a thin display panel can be obtained.

Optionally, the step 603 includes:

at least two inorganic layers stacked on the side, away from the base substrate, of the light-emitting device are formed and obtain a first encapsulation film layer;

a second encapsulation film layer on a side, away from the light-emitting device, of the first encapsulation film layer is formed. The second encapsulation film layer is doped with a light absorption particle, and the light absorption particle is configured to absorb the ambient light incident on the second encapsulation film layer.

Optionally, prior to the step 602, the method further includes that a ITT is formed on the base substrate.

Accordingly, the step 602 includes that a light-emitting device is formed on a side, away, from the base substrate, of the TFT.

Optionally, after the step 603, the method further includes: a photoelectric device is formed on a side, away from the light-emitting device, of the encapsulation structure. The photoelectric device has a light-transmitting area, and the orthographic projection area of the light emitting device on the base substrate is located in the orthographic projection area of the light-transmitting area of photoelectric device on the base substrate.

Optionally, that a photoelectric device is formed on a side, away from the light-emitting device, of the encapsulation structure includes:

a rigid base substrate is provided;

a flexible base is formed on the rigid base substrate;

a second electrode, a semiconductor structure layer and a first electrode are sequentially formed on a side, away from the rigid base substrate, of the flexible base to obtain a photoelectric device, the semiconductor structure layer includes a semiconductor thin film located in the light-transmitting area and a PIN structure located in the non-light-transmitting area, and a thickness of the semiconductor thin film is less than a thickness of the PIN structure;

a bonding layer is formed on a side, away from the flexible base, of the photoelectric device;

the photoelectric device is bonded to the encapsulation structure through the bonding layer; and the rigid base substrate is stripped off.

Optionally, that a photoelectric device is formed on a side, away from the light-emitting device, of the encapsulation structure, includes: a first electrode, a PIN structure layer and a second electrode are sequentially formed on a side, away from the light-emitting device, of the encapsulation structure.

All the above optional technical solutions may be in any combination to form an alternative embodiment of the present application, which will not be repeated in detail herein.

Figure 7:
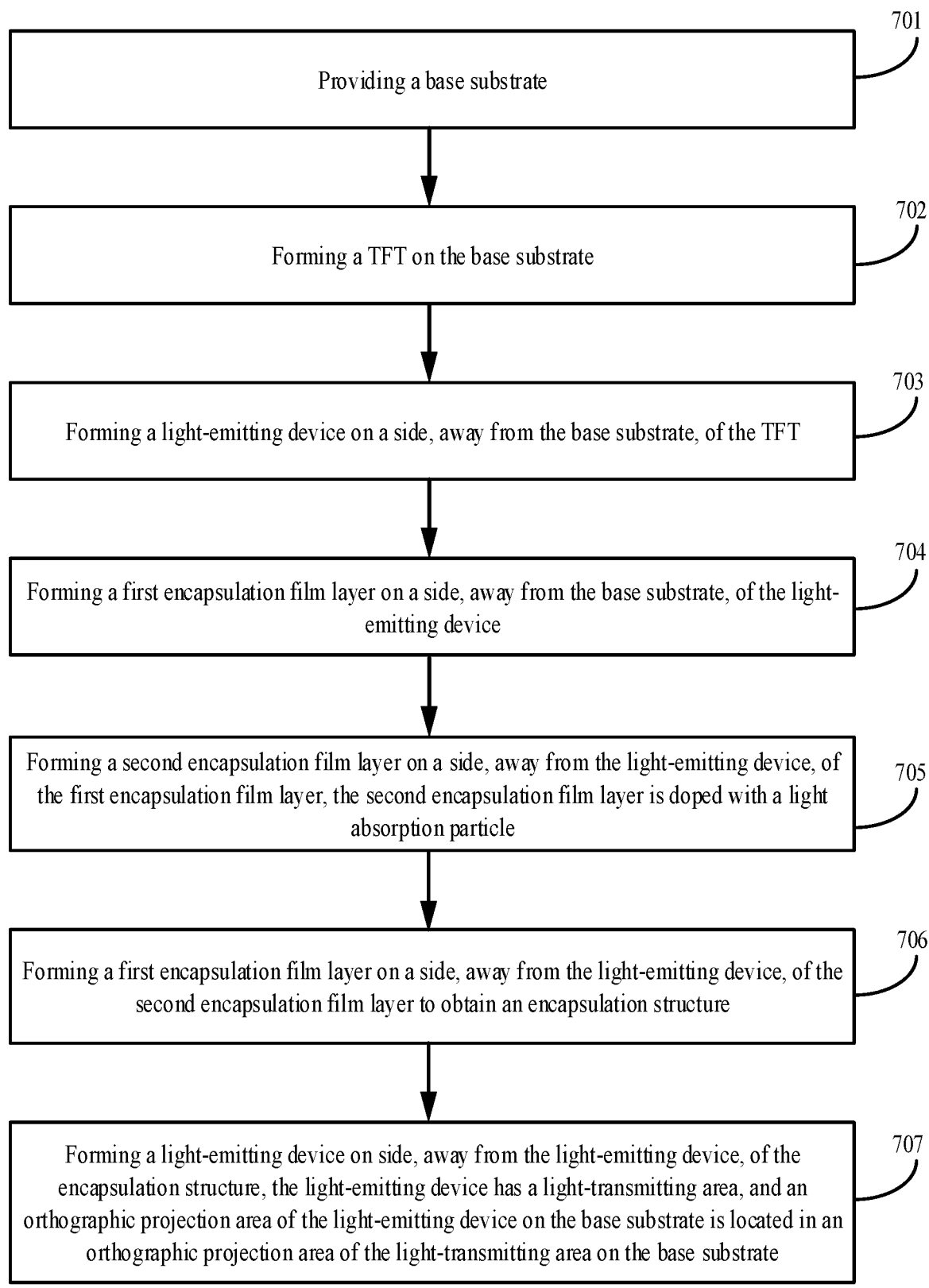
FIG. 7 is a flowchart of a method for manufacturing another display panel provided by an embodiment of the present application.

Please refer to FIG. 7, which shows a flowchart of another method for manufacturing a display panel provided by an embodiment of the present application. The embodiment of the present application will be explained by taking the manufacture of the display panel 1 shown in FIGS. 4 and 5 as an example. Referring to FIG. 7, a method for manufacturing a display panel includes the following steps:

in step 701, a base substrate is provided;

Wherein, the base substrate may be a hard base substrate or a flexible base substrate. The hard base substrate may be made of a light-guiding and non-metallic material with certain rigidity such as glass, quartz, transparent resin or the like, and the flexible base substrate may be a flexible substrate made of a flexible material such as PI and the like.

In a case that the base substrate is a rigid base substrate, the base substrate may be provided directly; and in a case that the base substrate is a flexible base substrate, a rigid base substrate may be provided first, then a flexible base may be formed on the rigid base substrate as the flexible base substrate, and a flexible base substrate may be provided through a rigid base substrate.

Optionally, in a case that the base substrate is a flexible base substrate, the rigid base substrate may be cleaned first, then a layer of PI solution may be coated on the rigid base substrate, and the coated PI solution may be dried to form the flexible base substrate. For example, a layer of PI solution with a thickness of 10 μm may be coated on the rigid base substrate, and then the coated PI solution may be dried at a temperature of 300° C. to 400° C. to form a flexible base substrate with a thickness of 10 μm.

In step 702, a TFT is formed on the base substrate.

Figure 8:
FIG. 8 is a schematic diagram of a TFT formed on a base substrate provided by an embodiment of the present application.

Please refer to FIG. 8, which shows a schematic diagram of a TFT 13 formed on a base substrate 10 provided by an embodiment of the present application. The TFT 13 may include a gate, a gate insulation layer, an active layer, an interlayer dielectric layer, a source and a drain (none are shown in FIG. 8), and the source and the drain may be on the same layer. Then, that a TFT 13 is formed on the base substrate 10 may include: a gate, a gate insulation layer, an active layer, an interlayer dielectric layer and a source-drain layer are sequentially formed on the base substrate 10, and the source-drain layer includes a source and a drain.

In step 703, a light-emitting device is formed on a side, away from the base substrate, of the TFT.

Figure 9:
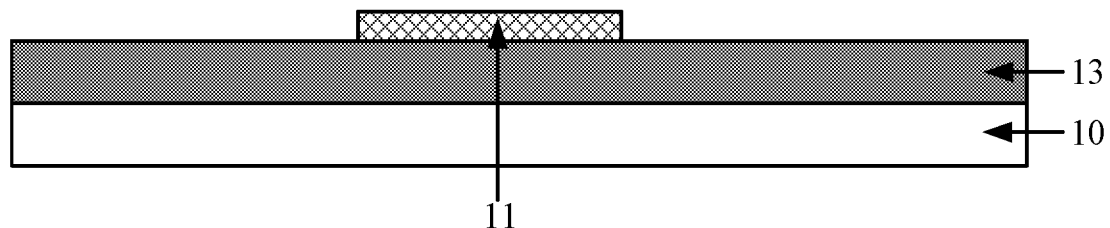
FIG. 9 is a schematic diagram of a light-emitting device formed on a side, away from a base substrate, of a TFT provided by an embodiment of the present application.

Please refer to FIG. 9, which shows a schematic diagram of a light-emitting device 11 formed on a side, away from the base substrate 10, of the TFT 13 provided by an embodiment of the present application. The TFT 13 may be an EL device, which may include an electroluminescence layer and an anode and a cathode for driving the electroluminescence layer to emit light. Then, that a light-emitting device 11 is formed on a side, away from the base substrate 10, of the TFT 13 may include: an anode, an electroluminescence layer and a cathode are sequentially formed on a side, away from the base substrate 10, of the TFT 13, and the anode, the electroluminescence layer and the cathode are sequentially stacked.

In step 704, a first encapsulation film layer is formed on a side, away from the base substrate, of the light-emitting device.

The first encapsulation film layer includes at least two inorganic layers arranged in a stack.

Figure 10:
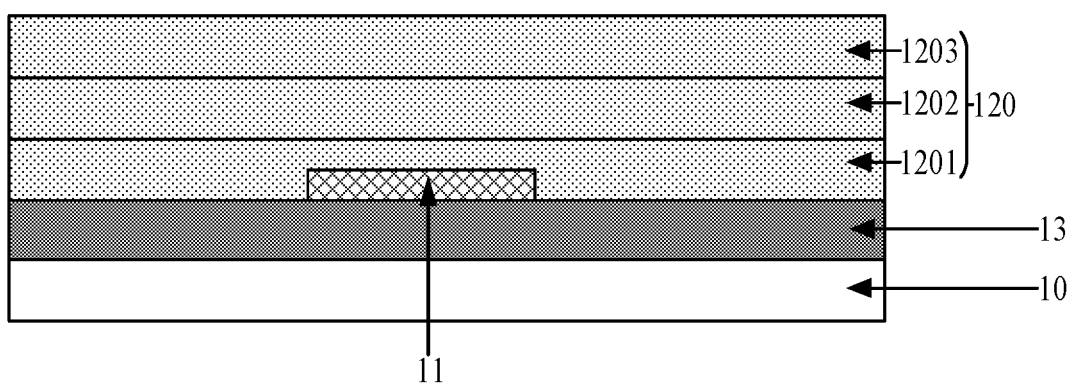
FIG. 10 is a schematic diagram of a first encapsulation film layer formed on a side, away from a base substrate, of a light-emitting device provided by an embodiment of the present application.

Please refer to FIG. 10, which shows a schematic diagram of a first encapsulation film layer 120 formed on a side, away from the base substrate 10, of the light-emitting device 11 provided by an embodiment of the present application. Referring to FIG. 10, the first encapsulation film layer 120 includes a first inorganic layer 1201, a second inorganic layer 1202 and a third inorganic layer 1203 arranged in a stack, the first inorganic layer 1201, the second inorganic layer 1202 and the third inorganic layer 1203 are sequentially stacked in a direction away from the light-emitting device 11, and refractive indexes of the third inorganic layer 1203, the second inorganic layer 1202 and the first inorganic layer 1201 sequentially increase in a direction close to the light-emitting device 11, A thickness of the first inorganic layer 1201 may be 200 nm to 300 nm, and a refractive index of the first inorganic layer 1201 may be 1.9 to 2.2, for example, the first inorganic layer 1201 is a $SiN_x$ film layer with a thickness of 200 nm to 300 nm. A thickness of the second inorganic layer 1202 may be 300 nm to 400 nm, and a refractive index of the second inorganic layer 1202 may be 1.5 to 1.7, for example, the second inorganic layer 1202 is a SiON film layer with a thickness of 300 nm to 400 nm. A thickness of the third inorganic layer 1203 may be 500 nm to 600 nm, and a refractive index of the third inorganic layer 1203 may be 1.1 to 1.2, for example, the third inorganic layer 1203 may be a $SiO_2$ film layer with a thickness of 500 nm to 600 nm.

Exemplarily, that a first encapsulation film layer 120 is formed on a side, away from the base substrate 10, of the light-emitting device 11 may include the following steps:

In step (1), a $SiN_x$ material layer is formed on a side, away from the base substrate 10, of the light-emitting device 11 by chemical vapor deposition (CVD), coating or sputtering, etc., and the $SiN_x$ material layer is processed by a primary patterning process to obtain the first inorganic layer 1201.

In step (2), a SiON material layer is formed on a side, away from the base substrate 10, of the first inorganic layer 1201 by CVD, coating or sputtering, etc., and the SiON material layer is processed by a primary patterning process to obtain the second inorganic layer 1202.

In step (3), a $SiO_2$ material layer is formed on a side, away from the base substrate 10, of the second inorganic layer 1202 by CVD, coating or sputtering, etc., and the $SiO_2$ material layer is processed by a primary patterning process to obtain the third inorganic layer 1203.

In step 705, a second encapsulation film layer is formed on a side, away from the light-emitting device, of the first encapsulation film layer, and the second encapsulation film layer is doped with a light absorption particle.

Figure 11:
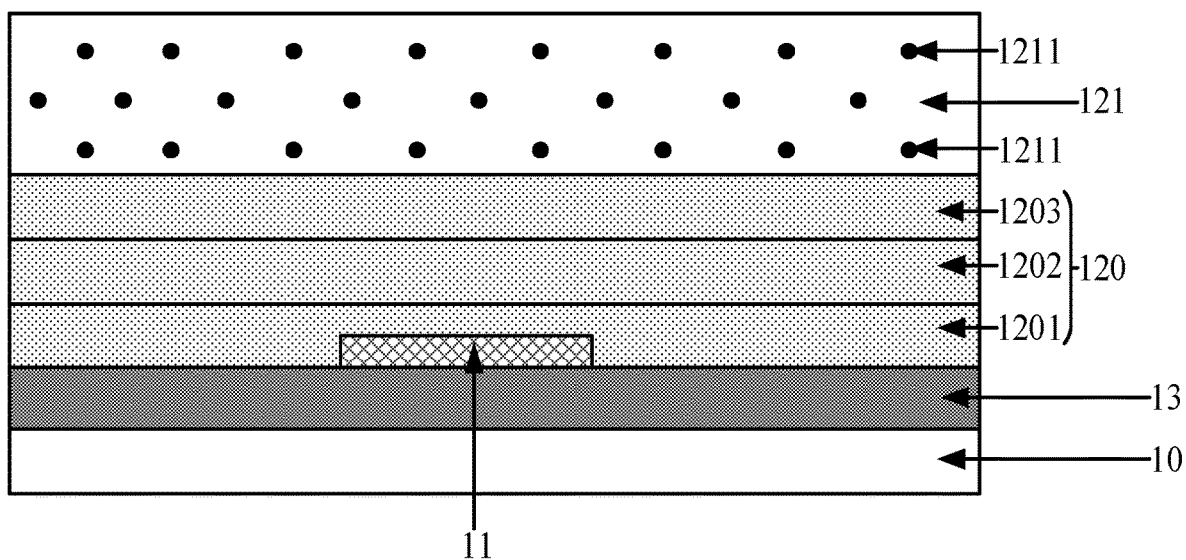
FIG. 11 is a schematic diagram of a second encapsulation film layer formed on a side, away from a light-emitting device, of a first encapsulation film layer provided by an embodiment of the present application.

Please refer to FIG. 11, which shows a schematic diagram of a second encapsulation film layer 121 on a side, away from the light-emitting device 11, of the first encapsulation film layer 120 provided by an embodiment of the present application. Referring to FIG. 11, the second encapsulation film layer 121 is doped with a light absorption particle 1211, and the light absorption particle 1211 is configured to absorb an ambient light incident on the second encapsulation film layer 120. Optionally, the second encapsulation film layer 121 may be an organic layer, and the light absorption particle 1211 may be an inorganic particle. Exemplarily, the light absorption particle 1211 may be a $SiO_2$ particle.

Exemplarily, that a second encapsulation film layer 121 is formed on a side, away from the light-emitting device 11, of the first encapsulation film layer 120 may include: first, mixing an organic material with a $SiO_2$ particle to obtain a mixed material, and then printing out a layer with this mixed material by an ink-jet printing (IJP) process on a side, away from the light-emitting device 11, of the first encapsulation film layer 120 and performing a drying process to obtain the second encapsulation film layer 121.

In step 706, a first encapsulation film layer is formed on a side, away from the light-emitting device, of the second encapsulation film layer, to obtain an encapsulation structure.

Exemplarily, the first encapsulation film layer includes at least two inorganic layers arranged in a stack.

Figure 12:
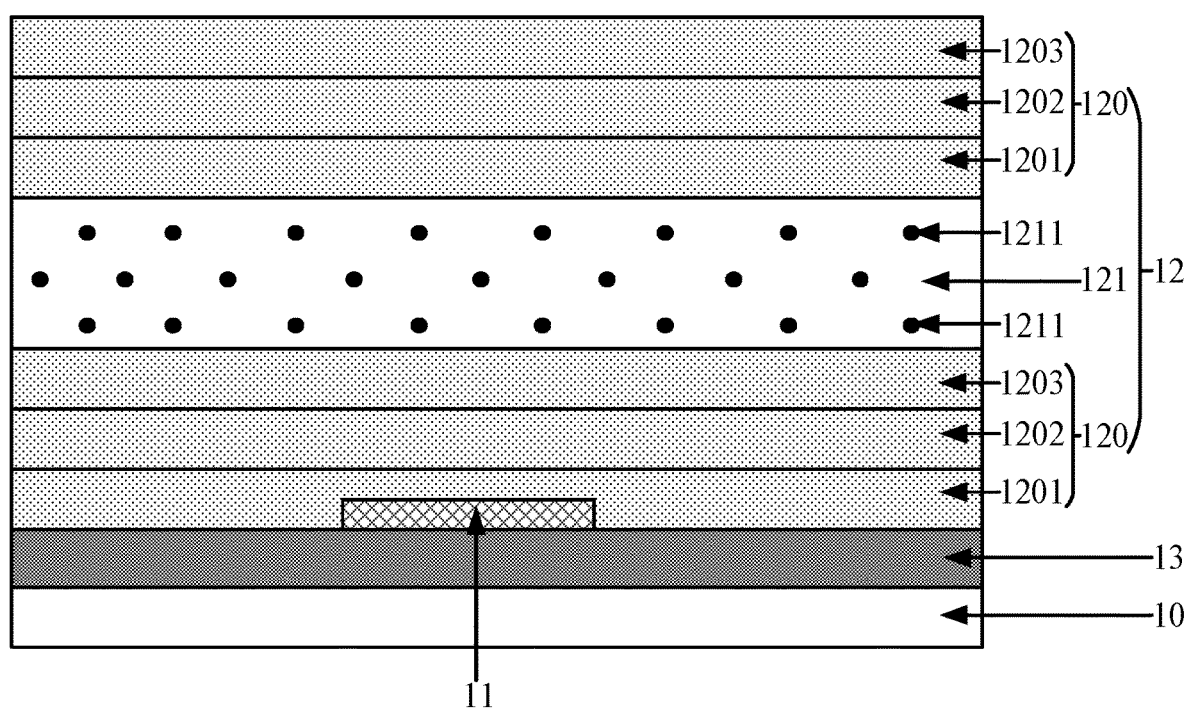
FIG. 12 is a schematic diagram of forming a first encapsulation film layer on a side, away from a light-emitting device, of a second encapsulation film layer provided by an embodiment of the present application.

Please refer to FIG. 12, which shows a schematic diagram of a first encapsulation film layer 120 on a side, away from the light-emitting device 11, of the second encapsulation film layer 121 provided by an embodiment of the present application. Referring to FIG. 12, the first encapsulation film layer 120 includes a first inorganic layer 1201, a second inorganic layer 1202 and a third inorganic layer 1203 arranged in a stack, the first inorganic layer 1201, the second inorganic layer 1202 and the third inorganic layer 1203 are sequentially stacked in a direction away from the light-emitting device 11, and refractive indexes of the third inorganic layer 1203, the second inorganic layer 1202 and the first inorganic layer 1201 sequentially increase in a direction close to the light-emitting device 11. For the process of forming a first encapsulation film layer 120 in this step 706, reference may be made to the foregoing step 704, which will not be repeated in detail herein in the embodiments of the present application.

It should be noted that FIG. 12 carries out an explanation by taking an encapsulation structure 12 including a first encapsulation film layer 120, a second encapsulation film layer 121 and a first encapsulation film layer 120 sequentially stacked in a direction away from the base substrate 10 as an example, and it is easy to be understood that the encapsulation structure 12 may include first encapsulation film layers 120 and second encapsulation film layers 121 that are alternately stacked. For the forming process of each encapsulation film layer 120, reference may be made to the step 704, and for the forming process of each second encapsulation film layer 121, reference may be made to step 705, which will not be repeated in detail herein in the embodiments of the present application.

In step 707, a photoelectric device is formed on a side, away from the light-emitting device, of the encapsulation structure, the photoelectric device has a light-transmitting area, and an orthographic projection area of the light emitting device on the base substrate is located in an orthographic projection area of the light-transmitting area on the base substrate.

In the embodiments of the present application, a photoelectric device may be prepared first, and then the photoelectric device may be bonded to a side, away from the light-emitting device, of the encapsulation structure. Optionally, the photoelectric device may be prepared on a side, away from the light-emitting device, of the encapsulation structure. Formation process of a photoelectric device will be explained below in two implementations.

Figure 13:
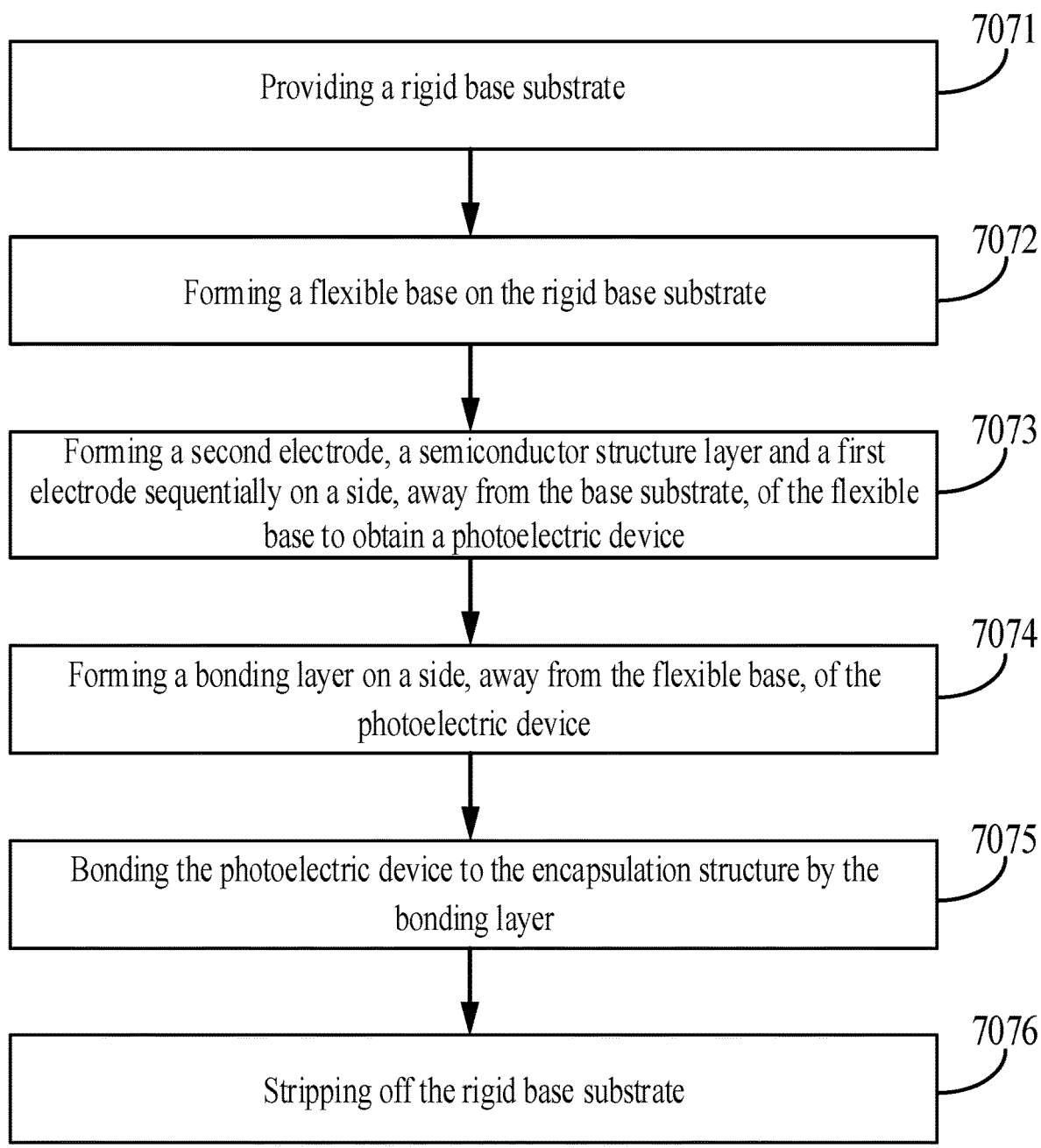
FIG. 13 is a flowchart of a method for forming a photoelectric device on a side, away from a light-emitting device, of an encapsulation structure provided by an embodiment of the present application.

The first implementation: first, preparing a photoelectric device, and then, bonding the photoelectric device to a side, away from the light-emitting device, of the encapsulation structure. Please refer to FIG. 13, which shows a flowchart of a method for forming a photoelectric device on a side, away from the light-emitting device, of an encapsulation structure provided by an embodiment of the present application. FIG. 13 will be explained by taking forming a photoelectric device 14 shown in FIG. 4 on a side, away from the light-emitting device 11, of an encapsulation structure 12 as an example. Referring to FIG. 13, the method includes the following steps:

in sub-step 7071, a rigid base substrate is provided.

The rigid base substrate may be a hard substrate made of a light-guiding and non-metallic material with certain rigidity such as glass, quartz, transparent resin or the like.

In sub-step 7072, a flexible base is formed on the rigid base substrate.

A material of the flexible base may be a flexible material such as PI, and a thickness of the flexible base may be 10 μm. Optionally, a layer of PI solution may be coated on the rigid base substrate, and the coated PI solution may be dried to form the flexible base. For example, a layer of PI solution with a thickness of 10 μm may be coated on the rigid base substrate, and then the coated PI solution may be dried at a temperature of 300° C. to 400° C. to form a flexible base with a thickness of 10 μm.

In sub-step 7073, a second electrode, a semiconductor structure layer and a first electrode are sequentially formed on a side, away from the rigid base substrate, of the flexible base to obtain a photoelectric device.

Figure 14:
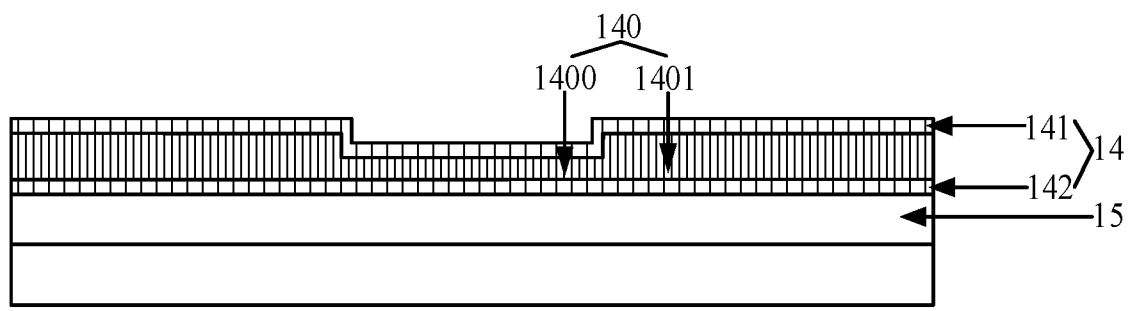
FIG. 14 is a schematic diagram of a photoelectric device formed on a side, away from a rigid base substrate, of a flexible base provided by an embodiment of the present application.

Please refer to FIG. 14, which is a schematic diagram showing that a second electrode 142, a semiconductor structure layer 140 and a first electrode 141 are sequentially formed on a side, away from the rigid base substrate (not shown in FIG. 14), of the flexible base 15 provided by an embodiment of the present application. Referring to FIG. 14, the photoelectric device 14 has a light-transmitting area (not shown in FIG. 14) and a non-light-transmitting area (not shown in FIG. 14), the semiconductor structure layer 140 includes a semiconductor thin film 1400 located in the light-transmitting area and a PIN structure 1401 located in the non-light-transmitting area, and a thickness of the semiconductor thin film 1400 is less than a thickness of the PIN structure 1401. The PIN structure 1401 may include a P-type semiconductor layer, an intrinsic semiconductor layer and an IN-type semiconductor layer that are sequentially stacked. The semiconductor thin film 1400 may be obtained by thinning the PIN structure. It is easy to be understood that the semiconductor thin film 1400 may include a P-type semiconductor layer, an N-type semiconductor layer and/or an intrinsic semiconductor layer. Optionally, a thickness of the semiconductor thin film 1400 may be 50 nm to 70 nm, a thickness of the PIN structure 1401 may be 2 μm to 3 μm, and both the first electrode 141 and the second electrode 142 may be ITO electrodes.

Exemplarily, that a second electrode 142, a semiconductor structure layer 140 and a first electrode 141 are sequentially formed on a side, away from the rigid base substrate, of the flexible base 15 may include the following steps:

In step (1), an ITO material layer is formed on a side, away from the rigid base substrate, of the flexible base 15 by CVD, coating or sputtering, etc., and the ITO material layer is processed by a primary patterning process to obtain the second electrode 142.

In step (2), a P-type semiconductor material layer, an intrinsic semiconductor material layer and an N-type semiconductor material layer are formed on a side, away from the flexible base 15, of the second electrode 142 by CVD, coating or sputtering, etc., and the P-type semiconductor material layer, the intrinsic semiconductor material layer and the N-type semiconductor material layer are processed by a primary patterning process to obtain the P-type semiconductor layer, the intrinsic semiconductor layer and the N-type semiconductor layer, i.e., a PIN structure layer. That the P-type semiconductor material layer is formed may include an intrinsic semiconductor material layer is formed by CVD, coating or sputtering, etc., and then P-type doping is performed on the intrinsic semiconductor material layer to obtain a P-type semiconductor material layer; and that an N-type semiconductor material layer is formed may include an intrinsic semiconductor material layer is formed by CVD, coating or sputtering, etc., and then N-type doping is performed on the intrinsic semiconductor material layer to obtain an N-type semiconductor material layer. Exemplarily, the material of the P-type semiconductor material layer may be P-type a-Si, the material of the intrinsic semiconductor material layer may be intrinsic a-Si, and the material of the N-type semiconductor material layer may be N-type a-Si.

It should be noted that the embodiments of the present application are explained by taking the simultaneous formation of a P-type semiconductor layer, an intrinsic semiconductor layer and an N-type semiconductor layer as an example. In practical applications, each time a semiconductor material layer (for example, a P-type semiconductor material layer) is formed, the semiconductor material layer may be processed by a primary patterning process to obtain a corresponding semiconductor layer (for example, a P-type semiconductor layer).

In step (3), a partial area of the PIN structure layer is thinned by a primary patterning process to obtain a semiconductor thin film 1400 and a PIN structure 1401, so as to obtain a semiconductor structure layer 140. The semiconductor thin film 1400 is a thinned portion of the PIN structure layer, and the PIN structure 1401 is a non-thinned portion of the PIN structure layer.

In step (4), a ITO material layer is formed on a side, away from the second electrode 142, of the semiconductor structure layer 140 by CVD, coating or sputtering, etc., and the ITO material layer is processed by a primary patterning process to obtain the first electrode 141.

In sub-step 7074, a bonding layer is formed on a side, away from the flexible base, of the photoelectric device.

Figure 15:
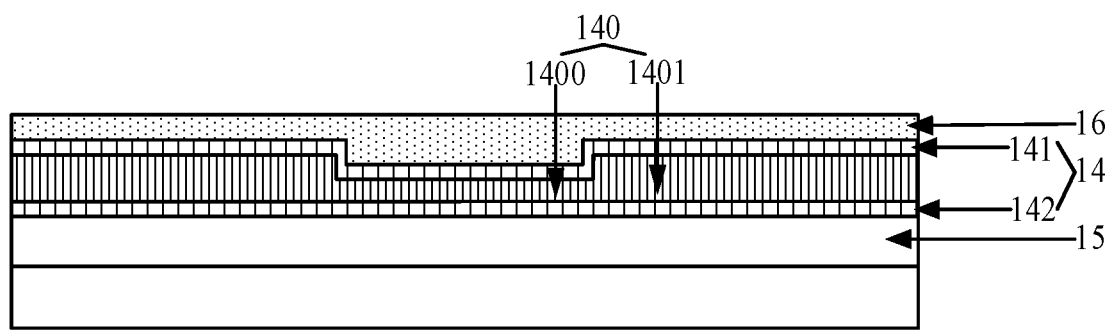
FIG. 15 is a schematic diagram of a bonding layer formed on a side, away from a flexible base, of a photoelectric device provided by an embodiment of the present application.
Figure 16:
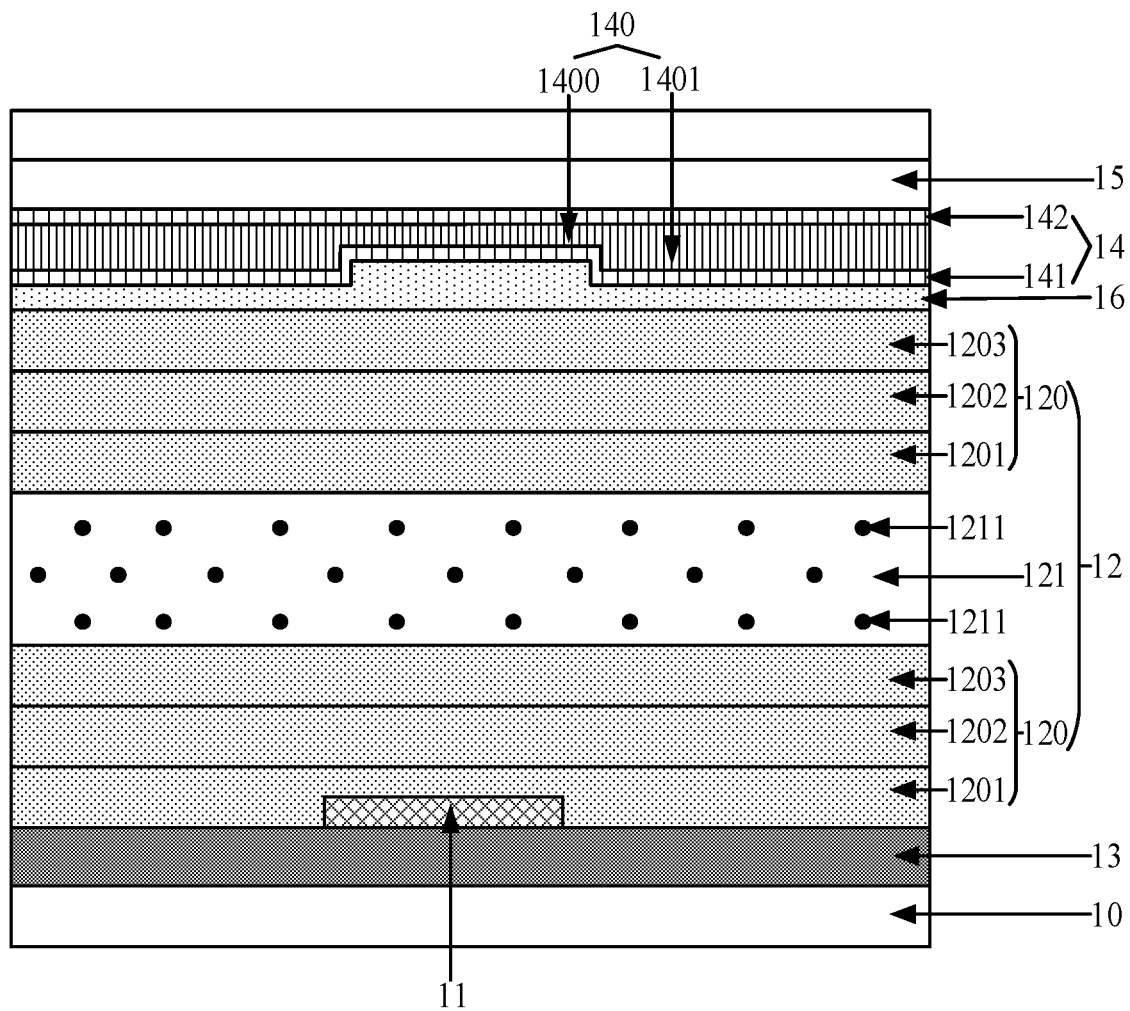
FIG. 16 is a schematic diagram of a photoelectric device and an encapsulation structure bonded by a bonding layer provided by an embodiment of the present application.

Please refer to FIG. 15, which shows a schematic diagram of a bonding layer 16 formed on a side, away from the flexible base 15, of the photoelectric device 14 provided by an embodiment of the present application, the material of the bonding layer 16 may be OCA or UV curable adhesive. Exemplarily, a layer of OCA may be coated on a side, away from the flexible base 15, of the photoelectric device 14 as the bonding layer 16.

In sub-step 7075, the photoelectric device is bonded to the encapsulation structure by the bonding layer.

Please refer to 16, which shows a schematic diagram of a photoelectric device 14 and an encapsulation structure 12 bonded by a bonding layer 16 provided by an embodiment of the present application. Optionally, the photoelectric device 14 and the encapsulation structure 12 may be bonded first, and then pressure may be applied to the photoelectric device 14 so as to bond the photoelectric device 14 and the encapsulation structure 12.

In sub-step 7076, the rigid base substrate is stripped off.

A schematic diagram in which the rigid base substrate is stripped off can be seen in FIG. 4, Exemplarily, the rigid base substrate may be stripped off by a laser lift off (LLO) process.

The second implementation: a photoelectric device is prepared on a side, away from the light-emitting device, of the encapsulation structure.

Referring to FIG. 5, a photoelectric device 14 includes a first electrode 143, a PIN structure 144 and a second electrode 145 that are sequentially stacked in a direction away from the encapsulation structure 12. Both the first electrode 143 and the second electrode 145 may be ITO electrodes, both the first electrode 143 and the second electrode 145 may have a thickness of 50 nm to 70 nm, and a thickness of the PIN structure 144 may be 50 nm to 100 nm. Then, the step 707 may include: a first electrode 143, a PIN structure 144 and a second electrode 145 are sequentially formed on a side, away from the light-emitting device 11, of the encapsulation structure 12. For the formation process of the first electrode 143, reference may be made to the step (1) in the foregoing sub-step 7073, for the formation process of the PIN structure 144, reference may be made to step (2) in the foregoing sub-step 7073, and for the formation process of the second electrode 145, reference may be made to step (4) in the foregoing sub-step 7073, which will not be repeated in detail herein.

It should be noted that, in the method for manufacturing a display panel provided by the embodiments of the present application, the involved (ND method may be plasma enhanced chemical vapor deposition (PECVD), the sputtering method may be magnetron sputter, and the involved primary patterning process includes photoresist coating, exposure, development, etching and photoresist stripping. Processing the material layer (for example, a $SiO_2$ material layer) by a primary patterning process to obtain a corresponding structure (for example, the third inorganic layer 1203) includes: coating a layer of photoresist on the material layer (for example, the $SiO_2$ material layer) to form a photoresist layer, exposing the photoresist layer to light by using a mask plate so as to form a fully exposed area and a non-exposed area on the photoresist layer, thereafter, using a development process to completely remove the photoresist in the fully exposed area, leaving all the photoresist in the non-exposed area, etching an area corresponding to the fully exposed area on the material layer (for example, the $SiO_2$ material layer) by an etching process, and finally stripping off the photoresist in the non-exposed area to obtain a corresponding structure (for example, the third inorganic layer 1203). Explanation is carried out herein by taking the use of photoresist as positive photoresist as an example. In a case that photoresist is negative photoresist, for the process of a primary patterning process, reference may be made to the description in this paragraph, which will not be repeated in detail herein.

It should also be noted that sequence of steps of the method for manufacturing a display panel provided by the embodiments of the present application may be adjusted appropriately, and steps may also be increased or decreased according to the situation. Within the technical scope disclosed in this application, any varied method that is easily conceivable for a person skilled in the art should be encompassed in the protection scope of this application, which is thus will not be repeated in detail.

In summary, in a display panel manufactured by a method for manufacturing a display panel provided by embodiments of the present application, an encapsulation structure includes a first encapsulation film layer, the first encapsulation film layer includes at least two inorganic layers, refractive indexes of the at least two inorganic layers sequentially increase in a direction close to the light-emitting device, and the first encapsulation film layer can adjust an angle of an ambient light through refraction and reflection of the ambient light of the two inorganic layers to reduce an amount of the ambient light reflected from the display panel, thereby reducing interference of ambient lights on lights emitted by the display panel. Since interference of ambient lights on lights emitted by the display panel can be reduced without providing a polarizer, light extraction efficiency of the display panel can be ensured and a thin display panel can be obtained. Further, the photoelectric device can convert an optical signal of the ambient light into an electrical signal to supply power to the display panel, so the photoelectric device can be used as a battery of the display panel.

The embodiments of the present application provide a display apparatus including a display panel, and a touch panel and a protective film that are sequentially provided on a light exiting surface of the display panel. The display panel may be a display panel 1 shown in any one of FIGS. 1 to 5.

Figure 17:
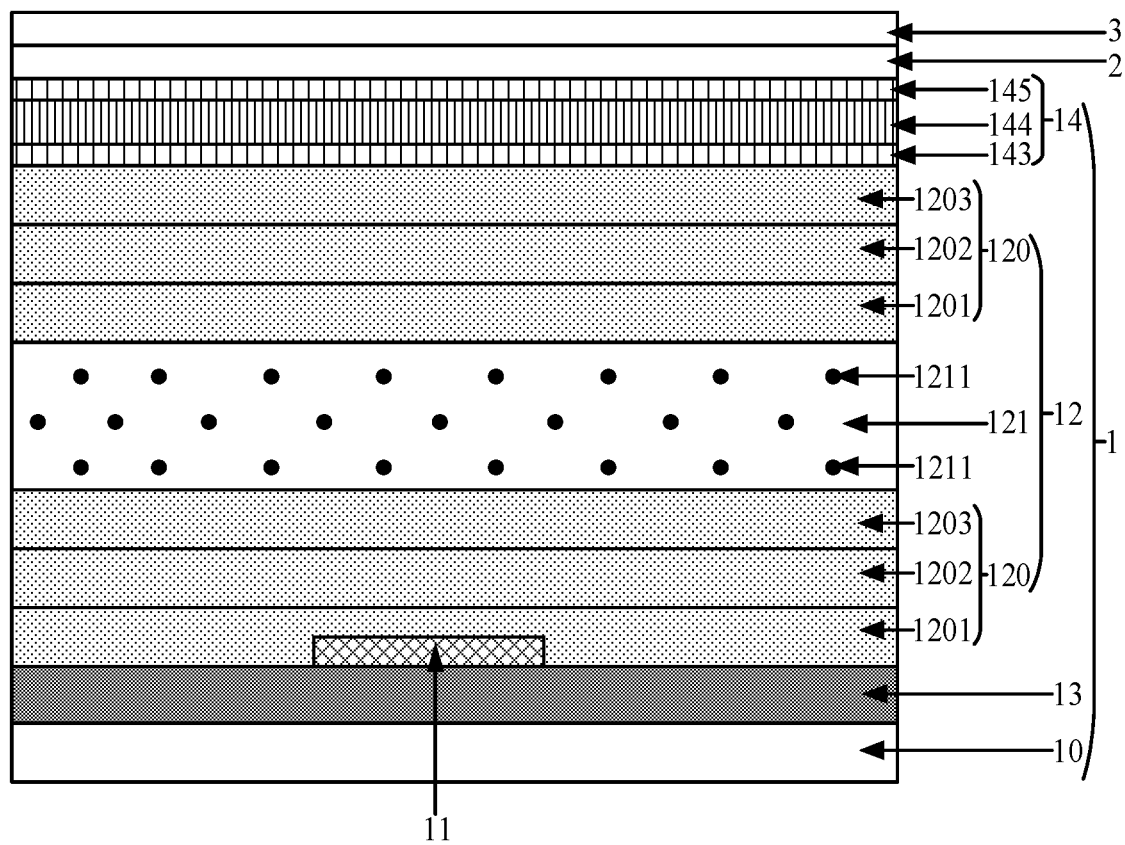
FIG. 17 is a schematic structural diagram of a display apparatus provided by an embodiment of the present application.

Exemplarily, please refer to FIG. 17, which shows a schematic structural diagram of a display apparatus provided by an embodiment of the present application. A display panel 1 in FIG. 17 is illustrated by taking the display panel 1 shown in FIG. 5 as an example. Referring to FIG. 17, the display apparatus includes a display panel 1, and a touch panel 2 and a protective film 3 provided on a light exiting surface of the display panel 1. Exemplarily, the touch panel 2 may be a capacitive touch panel, and the protective film 3 may be a protective film made of an organic material, for example, the protective film may be a protective film made of FI.

Optionally, the display apparatus may be an electroluminescence display apparatus, and may be a flexible display apparatus, for example, the display apparatus may be any product or component with a display function, such as a touch screen, electronic paper, a mobile phone, a tablet computer, a television, a display, a notebook computer, a digital photo frame, a navigator, a wearable apparatus or a virtual display apparatus, etc.

Other embodiments of the present disclosure will be apparent to those skilled in the art from consideration of the specification and practice of the present disclosure. This application is intended to cover any variations, uses, or adaptations of the present disclosure following the general principles thereof and including common knowledge or commonly used technical measures which are not disclosed herein. The specification and embodiments are to be considered as exemplary only, and the true scope and spirit of the present disclosure are indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure is only limited by the appended claims.

What is claimed is:

1. A display panel, comprising:
   a base substrate, and a light-emitting device and an encapsulation structure sequentially arranged on the base substrate;
   wherein the encapsulation structure comprises at least one first encapsulation film layer, the first encapsulation film layer comprises at least two inorganic layers arranged in a stack, and refractive indexes of the at least two inorganic layers sequentially increase in a direction close to the light-emitting device, the first encapsulation film layer is configured to adjust an angle of an ambient light incident on the light-emitting device to reduce the ambient light reflected from the display panel; and
   wherein the display panel further comprises:
   a photoelectric device located on a side, away from the light-emitting device, of the encapsulation structure, wherein the photoelectric device has a light-transmitting area, and an orthographic projection area of the light-emitting device on the base substrate is located in an orthographic projection area of the light-transmitting area on the base substrate; and
   wherein the photoelectric device further comprises a non-light-transmitting area, the photoelectric device comprises a semiconductor structure layer, and the semiconductor structure layer comprises a semiconductor thin film located in the light-transmitting area and a PIN structure located in the non-light-transmitting area, and a thickness of the semiconductor film is smaller than a thickness of the PIN structure.

2. The display panel according to claim 1, wherein the encapsulation structure further comprises a second encapsulation film layer stacked with the first encapsulation film layer, the second encapsulation film layer is doped with a light absorption particle, and the light absorption particle is configured to absorb an ambient light incident on the second encapsulation film layer.

3. The display panel according to claim 2, wherein the encapsulation structure comprises the first encapsulation film layer, the second encapsulation film layer and the first encapsulation layer stacked in a direction away from the base substrate, and the first encapsulation film layer comprises three inorganic layers arranged in a stack.

4. The display panel according to claim 1, wherein the photoelectric device further comprises a first electrode located on a side, close to the encapsulation structure, of the semiconductor structure layer, and a second electrode on a side, away from the encapsulation structure, of the semiconductor structure layer, and the first electrode, the semiconductor structure layer and the second electrode are sequentially stacked.

5. A display apparatus comprising the display panel claim 1, and a touch panel and a protective film sequentially arranged on a light exiting surface of the display panel.

6. The display panel according to claim 2, wherein the second encapsulation film layer is an organic layer, and the light absorption particle is an inorganic particle.

7. The display panel according to claim 1, wherein the display panel further comprises a thin film transistor TFT located between the base substrate and the light-emitting device.

8. The display panel according to claim 1, wherein a thickness of the semiconductor thin film is 50 nm to 70 nm, and a thickness of the PIN structure is 2 μm to 3 μm.

9. The display panel according to claim 1, wherein the photoelectric device is a transparent device, and a thickness of the photoelectric device is 150 nm to 240 nm.

10. The display panel according to claim 1, wherein the photoelectric device comprises a first electrode, the PIN structure and a second electrode, which are sequentially stacked in a direction away from the encapsulation structure.

11. The display panel according to 1, wherein the display panel further comprises a flexible base on a side, away from the encapsulation structure, of the photoelectric device, and a bonding layer between the photoelectric device and the encapsulation structure.

12. A method for manufacturing a display panel, comprising:
    providing a base substrate;
    forming a light-emitting device on the base substrate;
    forming an encapsulation structure on a side, away from the base substrate, of the light-emitting device, wherein the encapsulation structure comprises at least one first encapsulation film layer, the first encapsulation film layer comprises at least two inorganic layers arranged in a stack, and refractive indexes of the at least two inorganic layers sequentially increase in a direction close to the light-emitting device, the first encapsulation film layer is configured to adjust an angle of an ambient light incident on the light-emitting device to reduce an amount of ambient light reflected from the display panel; and
    wherein the method further comprises:
    forming a photoelectric device on a side, away from the light-emitting device, of the encapsulation structure, wherein the photoelectric device has a light-transmitting area, and an orthographic projection area of the light-emitting device on the base substrate is located in an orthographic projection area of the light-transmitting area on the base substrate; and
    wherein the photoelectric device further comprises a non-light-transmitting area, the photoelectric device comprises a semiconductor structure layer, and the semiconductor structure layer comprises a semiconductor thin film located in the light-transmitting area and a PIN structure located in the non-light-transmitting area, and a thickness of the semiconductor film is smaller than a thickness of the PIN structure.

13. The method according to claim 12, wherein the forming the encapsulation structure on the side, away from the base substrate, of the light-emitting device, comprises:
    forming at least two inorganic layers stacked on a side, away from the base substrate, of the light-emitting device to obtain the first encapsulation film layer; and
    forming a second encapsulation film layer on a side, away from the light-emitting device, of the first encapsulation film layer, wherein the second encapsulation film layer is doped with a light absorption particle, and the light absorption particle is configured to absorb an ambient light incident on the second encapsulation film layer.

14. The method for manufacturing a display panel according to claim 12, wherein,
    before forming the light-emitting device on the base substrate, the method further comprises forming a TFT on the base substrate; and
    the forming the light-emitting device on the base substrate comprises:
forming a light-emitting device on a side, away from the base substrate, of the TFT.

15. The method according to claim 12, wherein the forming the photoelectric device on the side, away from the light-emitting device, of the encapsulation structure comprises:
    providing a rigid base substrate;
    forming a flexible base on the rigid base substrate;
    forming a second electrode, a semiconductor structure layer and a first electrode sequentially on a side, away from the rigid base substrate, of the flexible base;
    forming a bonding layer on a side, away from the flexible base, of the photoelectric device;
    bonding the photoelectric device to the encapsulation structure through the bonding layer; and;
    stripping off the rigid base substrate.

16. The method according to claim 12, wherein the forming the photoelectric device on the side, away from the light-emitting device, of the encapsulation structure comprises:
    forming a first electrode, the PIN structure and a second electrode sequentially on a side, away from the light-emitting device, of the encapsulation structure.

* * * * *